United States Patent [19]
Chu et al.

[11] Patent Number: 5,496,666
[45] Date of Patent: Mar. 5, 1996

[54] CONTACT HOLE MASK FOR SEMICONDUCTOR FABRICATION

[75] Inventors: Ron-Fu Chu, East Singapore; Chun H. Yik, Singapore, both of Singapore

[73] Assignee: Chartered Semiconductor Manufacturing PTE Ltd., Singapore

[21] Appl. No.: 329,887

[22] Filed: Oct. 27, 1994

[51] Int. Cl.[6] ............................................. G03F 9/00
[52] U.S. Cl. ............................ 430/5; 430/322; 430/324; 378/34; 378/35
[58] Field of Search .............................. 430/5, 322, 324; 378/34, 35

[56] References Cited

U.S. PATENT DOCUMENTS 5,286,584  2/1994  Gemmink et al. ........................ 430/5

*Primary Examiner*—S. Rosasco
*Attorney, Agent, or Firm*—George O. Saile; Larry Prescott

[57] ABSTRACT

This invention provides an improved process latitude mask for forming contact or via hole openings in a photoresist masking layer in the fabrication of semiconductor integrated circuits. The invention also provides a method of forming contact or via hole openings in a photoresist masking layer using an improved process latitude mask. The improved process latitude mask, called a dot mask, uses an opaque blocking area formed in the center of the primary opening in a projection mask for forming contact or via hole openings in a photoresist layer. The opaque blocking area is equal to or less than the area of the primary opening divided by nine. The opaque blocking area is small enough so that it will not form an image in the photoresist layer. The opaque blocking area modifies the light intensity profile at the photoresist layer in a manner which improves process latitude.

20 Claims, 7 Drawing Sheets

CONTACT HOLE MASK FOR SEMICONDUCTOR FABRICATION

BACKGROUND OF THE INVENTION

1. Field of the Invention

The invention relates to an improved process latitude, especially depth-of-focus, projection mask for forming contact or via hole openings in a photoresist masking layer in the formation of semiconductor integrated circuits. The improved process latitude mask uses an opaque blocking area in the center of the primary opening in the projection mask. The area of the opaque blocking area is no larger than the area of the primary mask opening divided by nine and will not form a pattern in the photoresist. The opaque blocking area alters the light intensity at the photoresist and improves the process latitude.

2. Description of the Related Art

For high resolution applications the process latitude of conventional projection masks for forming contact or via hole openings in photoresist is limited and often will not be sufficient to accommodate the surface variations of the semiconductor wafer being manufactured. There have been attempts to improve process latitude with small enlargements at the corners of a square primary opening in a projection mask. This invention uses an opaque blocking area in the center of the primary opening of the projection mask.

SUMMARY OF THE INVENTION

It is a principle object of this invention to provide a mask with an improved process latitude for forming submicron contact or via holes in semiconductor integrated circuits.

It is a further object of this invention to provide a method of forming submicron contact or via holes in semiconductor integrated circuits using a mask with an improved process latitude.

These objectives are achieved by modification of the mask used to form the contact hole image on the photoresist layer which will become the contact hole mask. An opaque blocking pattern is formed in the primary opening of the mask to form a modified mask, called a dot mask. The area of the opaque blocking pattern is no larger than the area of the primary opening divided by nine.

The conventional mask for forming contact or via holes is shown in FIG. 1A and FIG. 1B comprising a square transparent opening 30 in a layer of opaque material 32. Light 50 passing through the transparent opening is focused on a layer of photoresist 22 formed on a semiconductor integrated circuit substrate 20, shown in FIG. 1C, having devices and other features, not shown here, formed therein. FIG. 2 shows a computer simulation of the relative intensity the light with a wavelength of 0.365 microns passing through a primary opening of 0.6 microns by 0.6 microns at a defocus distance of −1.3499 microns. The relative intensity is the ratio of the light intensity at the nominal focus distance of the photoresist layer to the light intensity available at the source. The relative intensity has a large variation of 0.28 or 28% from the center of the primary opening 71 to the edges of the primary opening 72. This large relative intensity variation results in a low depth-of-focus.

FIG. 3A and FIG. 3B show the problems which can occur using the conventional mask in forming the contact or via hole opening in the photoresist layer 22. The contact or via hole may not be completely formed, as shown in FIG. 3A, or may have too large an aspect ratio, as shown in FIG. 3B.

In this invention a small opaque blocking pattern, having an area equal to or less than the area of the primary opening, is placed at the center of the primary opening, as shown in FIG. 4A and FIG. 4B. The opaque blocking pattern is small enough that it will not be formed in the final image at the photoresist but it will shape the intensity profile to reduce the variation in the intensity from the center to the edges of the primary opening. The effect of the dot mask on the intensity profile can be seen in FIG. 5B. The intensity of the light passing through the dot mask 63 is the sum of the intensity of the light passing on either side of the opaque blocking pattern 61 and 62. FIG. 6 shows a computer simulation of the relative intensity light with a wavelength of 0.365 microns passing through the transparent area of a dot mask, having a primary opening of 0.6 microns by 0.6 microns and an opaque blocking pattern of 0.16 microns by 0.16 microns, at the nominal focus distance of the photoresist layer. The relative intensity is the ratio of the light intensity at the nominal focus distance of the photoresist layer to the light intensity available at the source. The relative intensity has a variation of 0.16 or 16% from the center of the primary opening 71 to the edges of the primary opening 72. This reduced relative intensity variation results in an increased depth-of-focus.

DESCRIPTION OF PREFERRED EMBODIMENTS

Figure 4A:
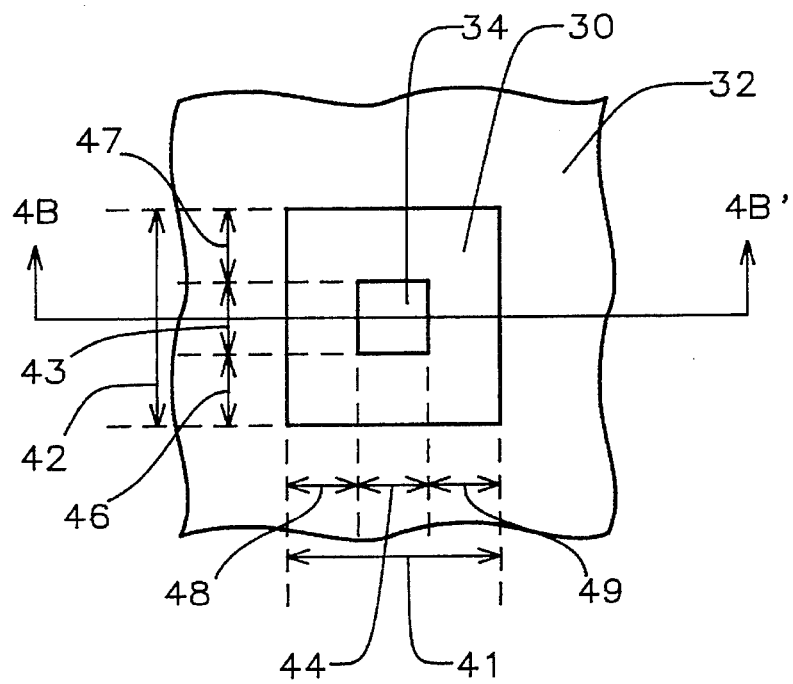
FIG. 4A shows a top view of a dot mask of this invention for forming contact or via holes in semiconductor integrated circuits.
Figure 4B:
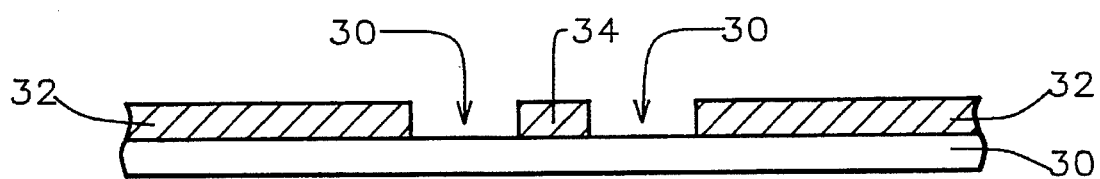
FIG. 4B shows a cross section view of a dot mask of this invention for forming contact or via holes in semiconductor integrated circuits.

Refer now to FIG. 4A through FIG. 7, There is shown a principle embodiment of the dot mask for forming an improved depth-of-focus image, such as for a contact or via hole opening. The mask will be used to form a contact hole opening in a photoresist masking layer using light projected through the transparent areas of the mask. The linear dimensions of the mask will be reduced five times as the image is focused on the layer of photoresist. FIG. 4A shows a top view of the dot mask showing the primary opening of the mask 30, formed in the layer of opaque mask material 32, and the opaque blocking pattern 34. FIG. 4B shows a cross section view of the dot mask. The substrate 30 is a transparent material such as quartz. The layer of opaque material 32 and the opaque blocking pattern 34 are formed in an opaque material such as chrome. In this embodiment the primary opening of the mask 30 is a square having sides 41, 42 of between about 0.6 microns and 0.8 microns and the opaque blocking pattern 34 is also a square having sides 43, 44 of between about 0.16 microns and 0.2 microns. The center of the opaque blocking pattern 34 is located at the center of the primary opening 30 and the sides of the opaque blocking pattern 34 are parallel to the nearest sides of the primary opening 30. The spaces 46, 47 48, and 49 between the edges of the opaque blocking pattern 34 and the primary opening 30 are nearly equal.

Figure 5A:
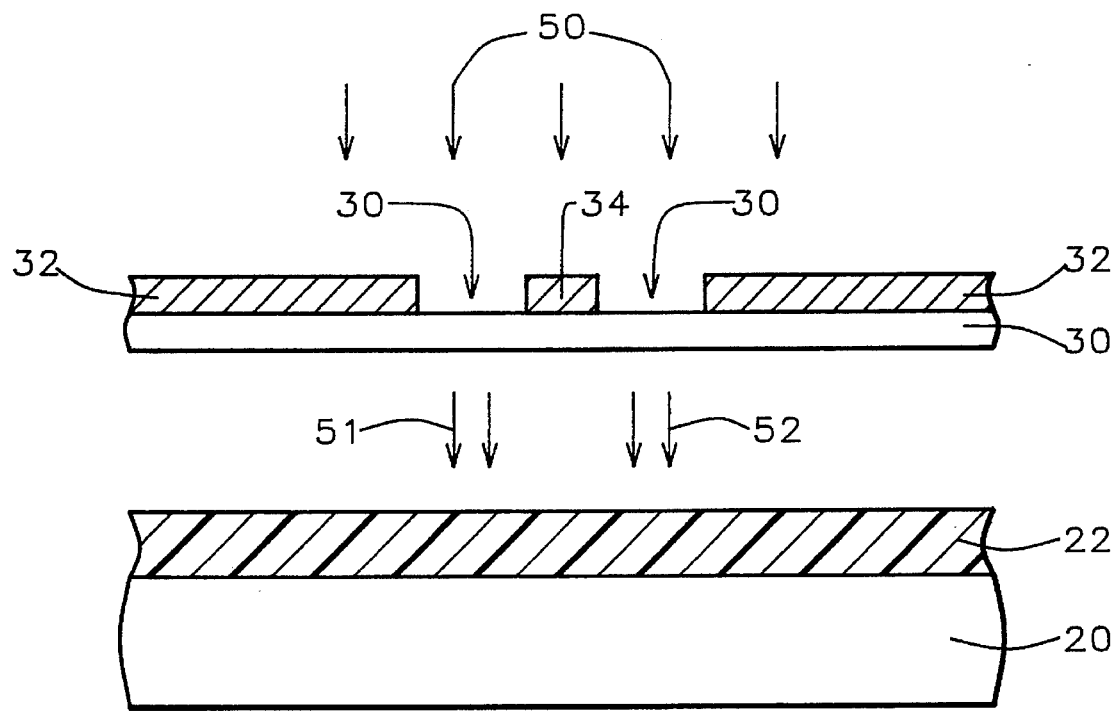
FIG. 5A shows a cross section view of light passing through a dot mask of this invention onto a layer of photoresist.
Figure 5B:
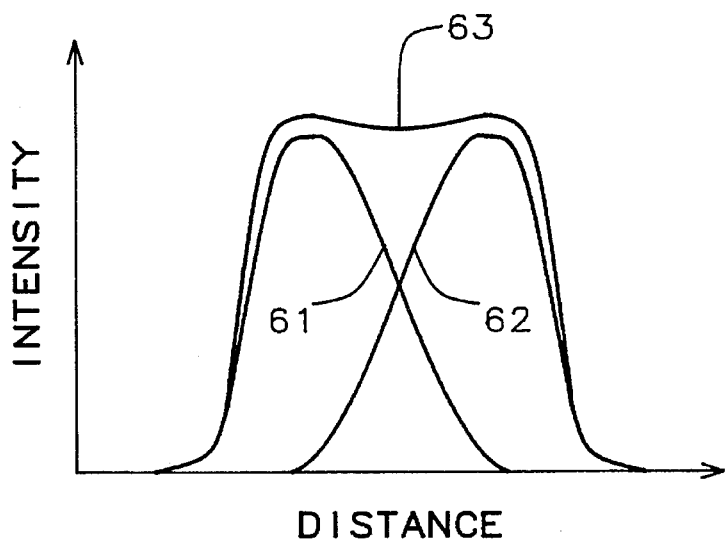
FIG. 5B shows the intensity profile at the photoresist layer of light passing through the dot mask of this invention.

FIG. 5A shows a cross section of the dot mask being used to form a contact hole opening in the payer of photoresist 22 formed on the semiconductor substrate 20 undergoing the fabrication process. Devices and other features formed in the semiconductor substrate are not shown. Light 50, with a wavelength such as 0.365 microns, is directed toward the dot mask passing through the transparent areas of the primary opening 30. The light passing through the dot mask 51, 52 is focused on the layer of photoresist 22 so that linear dimensions in the dot mask are reduced five times at the surface of the photoresist. FIG. 5B shows the intensity of the light at the photoresist passing through the transparent area of the dot mask 51, 52. FIG. 5B shows the intensity profiles 61, 62 of the light passing through separate sections of the transparent area of the primary opening, however the total light intensity 63 or the sum of the intensity profiles 61 and 62 of the light passing through separate sections of the transparent area of the dot mask 51 and 52 is the light intensity actually reaching the photoresist 22. Computer simulations show that the total intensity within the boundaries of the primary opening is more uniform than for the case of a primary opening with no opaque blocking area thereby providing an improved depth-of-focus.

Figure 6:
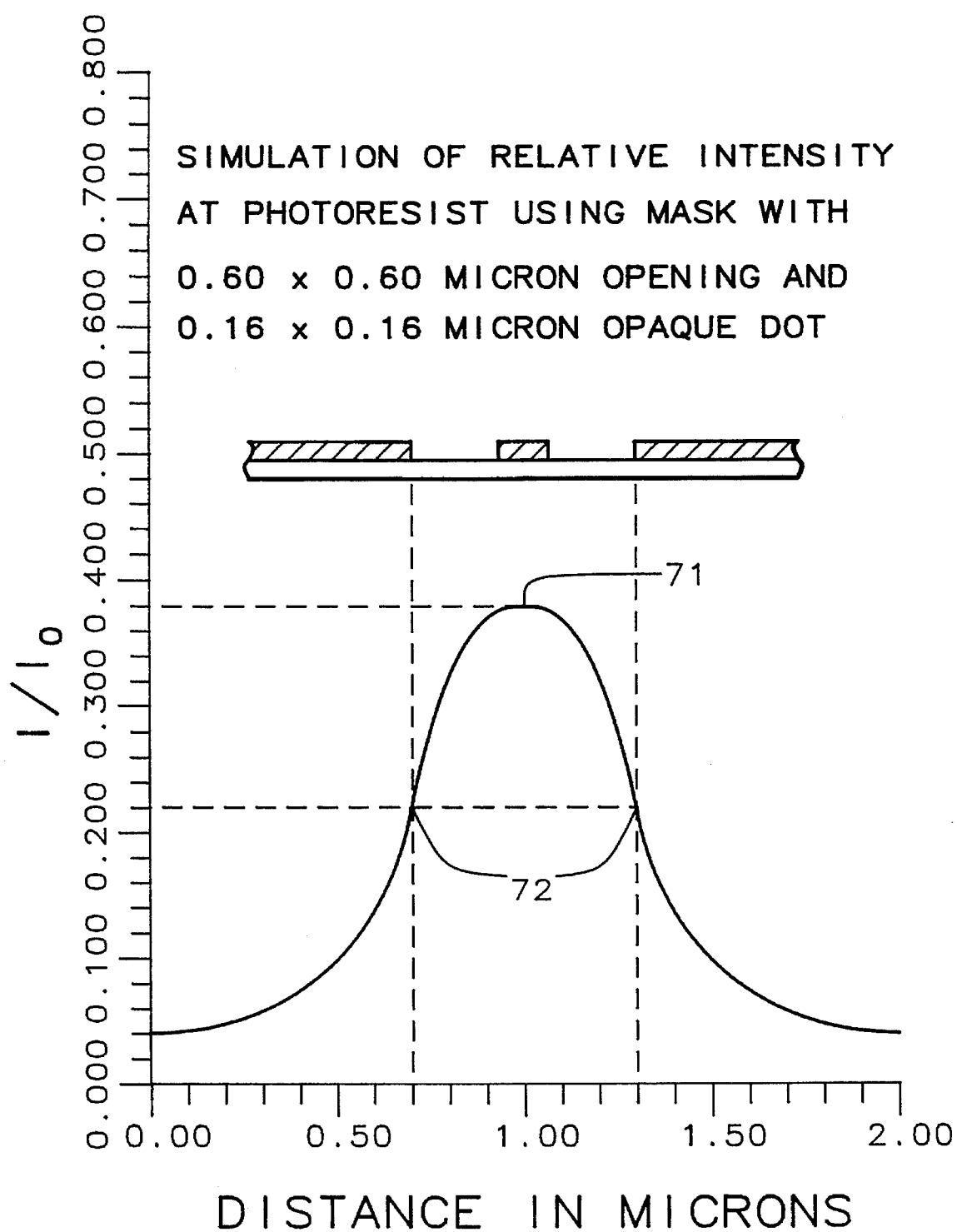
FIG. 6 shows the results of a computer simulation of the intensity of light passing through a dot mask of this invention.
Figure 7:
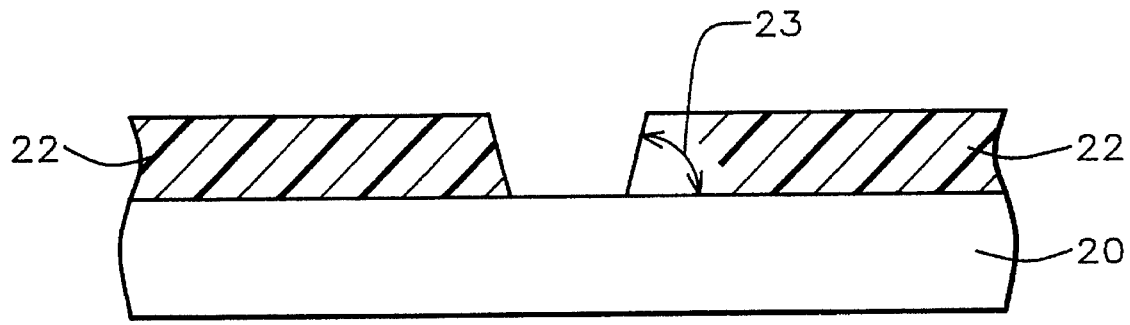
FIG. 7 shows a cross section view of a contact or via hole opening formed in a layer of photoresist using the dot mask of this invention.

FIG. 6 shows the results of a computer simulation of the relative intensity at the nominal focus distance of the photoresist layer of light with a wavelength of 0.365 microns passing through a dot mask with a primary opening of 0.6 by 0.6 microns and an opaque blocking pattern of 0.16 by 0.16 microns. The relative intensity is the ratio of the simulated intensity to the intensity available at the light source. The relative intensity variation from the center of the primary opening 71 to the edges of the primary opening 72 is 0.16 or 16% compared to 0.28 or 28% for the simulation results of a primary opening of 0.6 by 0.6 microns with no opaque blocking area, a wavelength of 0.365 microns, and the nominal focus distance of the photoresist layer shown in FIG. 2. This decrease in relative intensity variation over the region of the primary opening results in improved procell latitude. FIG. 7 shows the resulting contact hole opening in the photoresist mask. The angle between the contact hole opening edge and a line perpendicular to the surface of the substrate is between 80° and 90°.

Figure 8:
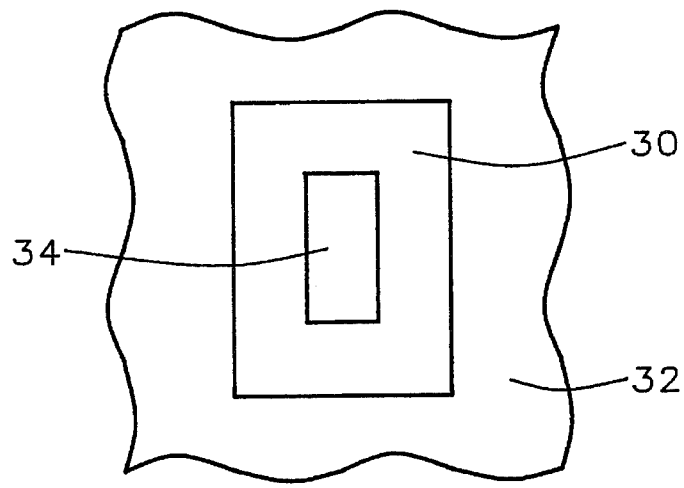
FIG. 8 shows a top view of a dot mask of this invention with a rectangular pattern.

FIG. 8 shows another embodiment of the dot mask for forming an improved depth-of-focus image, such as a contact or via hole opening. In this embodiment the primary opening 30 and the opaque blocking pattern 34 are rectangles. The longer sides of the opaque blocking pattern are parallel to the longer sides of the primary opening. The shorter sides of the opaque blocking pattern are parallel to the shorter sides of the primary opening. The opaque blocking pattern is centered in the primary opening so that the spaces between the longer sides of the opaque blocking pattern and the longer sides of the primary opening are nearly equal and the spaces between the shorter sides of the opaque blocking pattern and the shorter sides of the primary opening are nearly equal.

Figure 9:
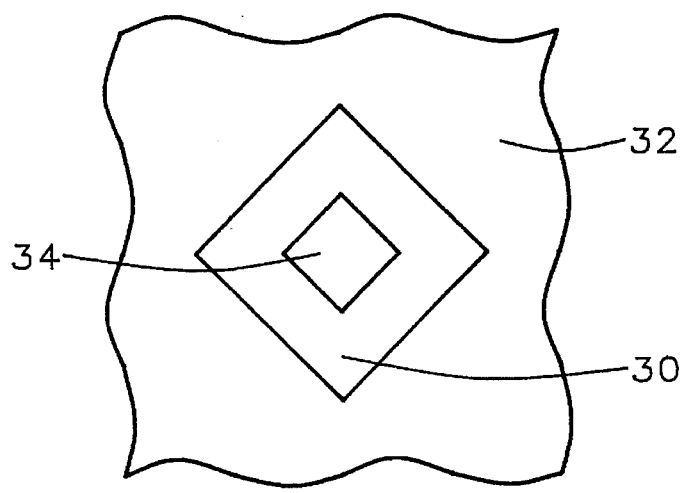
FIG. 9 shows a top view of a dot mask of this invention with a diamond or parallelogram pattern.

FIG. 9 shows another embodiment of the dot mask for forming an improved depth-of-focus image, such as a contact or via hole opening. In this embodiment the primary opening 30 and the opaque blocking pattern 34 are parallelograms or diamond shaped. The opaque blocking pattern 34 is centered in the primary opening 30.

Refer now to FIG. 4A through FIG. 7, There is shown a principle embodiment of a method of forming an improved depth-of-focus image, such as for a contact or via hole opening, using a dot mask. The dot mask is shown in FIG. 4A and FIG. 4B. FIG. 4A shows a top view of the dot mask showing the primary opening of the mask 30, formed in the layer of opaque mask material 32, and the opaque blocking pattern 34. FIG. 4B shows a cross section view of the dot mask. The substrate 30 is a transparent material such as quartz. The layer of opaque material 32 and the opaque blocking pattern 34 are formed in an opaque material such as chrome. The primary opening of the mask 30 is a square having sides 41, 42 of between about 0.6 microns and 0.8 microns and the opaque blocking pattern 34 is also a square having sides 43, 44 of between about 0.16 microns and 0.2 microns. The center of the opaque blocking pattern 34 is located at the center of the primary opening 30 and the sides of the opaque blocking pattern 34 are parallel to the nearest sides of the primary opening 30. The spaces 46, 47 48, and 49 between the edges of the opaque blocking pattern 34 and the primary opening 30 are nearly equal.

As shown in FIG. 5A, light, such as light with a 0.365 micron wavelength, is projected through the primary opening 30 of the dot mask onto the photoresist layer 22 formed on the semiconductor substrate 20. The semiconductor substrate 20 has devices and other features formed therein which are not shown here. The light projected onto the photoresist layer will form an opening in the photoresist layer which will then become the mask for forming the contact hole or via opening in the semiconductor substrate. The light passing through the dot mask 51, 52 is focused on the layer of photoresist 22 so that linear dimensions in the dot mask are reduced five times at the surface of the photoresist.

FIG. 5B shows the intensity of the light at the photoresist passing through the transparent area of the dot mask 51, 52. FIG. 5B shows the intensity profiles 61, 62 of the light passing through separate sections of the transparent area of the primary opening, however the total light intensity 63 or the sum of the intensity profiles 61 and 62 of the light passing through separate sections of the transparent area of the dot mask 51 and 52 is the light intensity actually reaching the photoresist 22. FIG. 6 shows a computer simulation of the relative light intensity of light with a wavelength of 0.365 microns projected through a dot mask with a primary opening of 0.6 by 0.6 microns and an opaque blocking pattern of 0.16 by 0.16 microns at the nominal focus distance of the photoresist layer. The relative light intensity is the ratio of the intensity at the nominal focus distance of the photoresist layer to the light intensity available at the source.

Figure 1A:
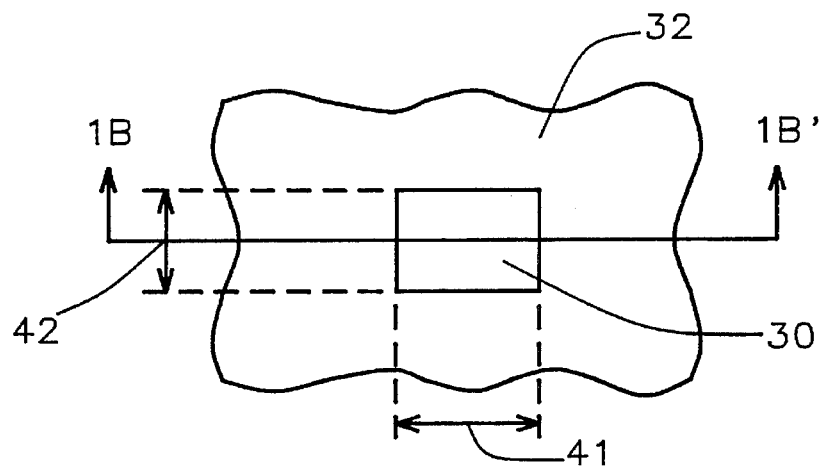
FIG. 1A shows a top view of a conventional mask for forming contact or via holes in semiconductor integrated circuits.
Figure 1B:
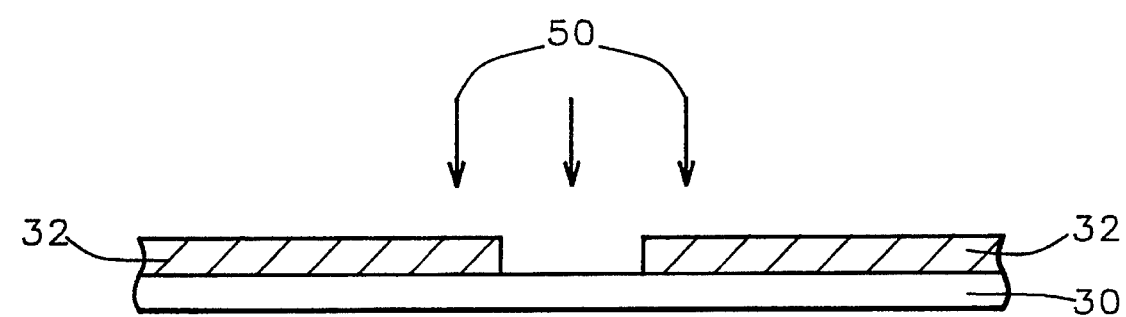
FIG. 1B shows a cross section view of a conventional mask for forming contact or via holes in semiconductor integrated circuits.
Figure 1C:
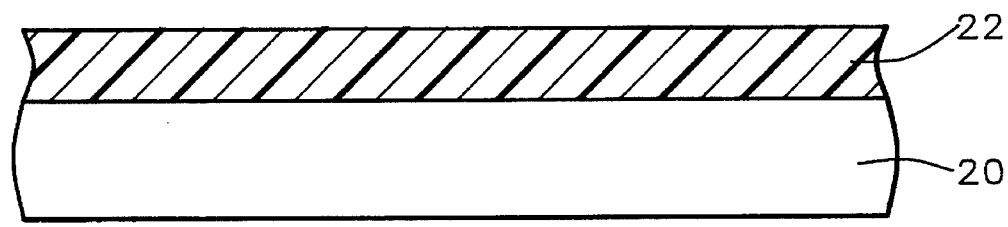
FIG. 1C shows a cross section view of a semiconductor integrated circuit substrate with a layer of photoresist formed on the substrate surface.
Figure 2:
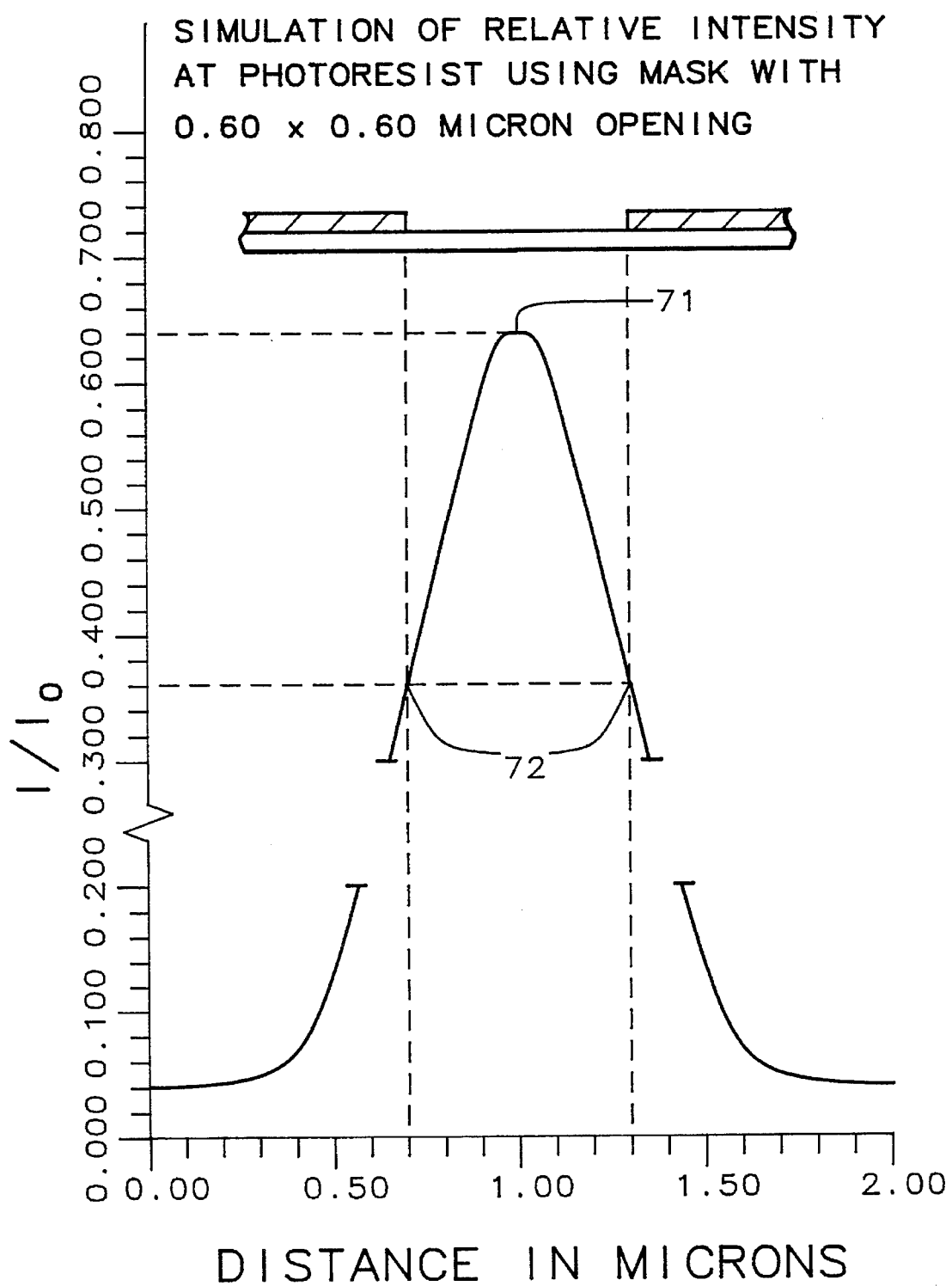
FIG. 2 shows the results of a computer simulation of the intensity of light passing through conventional mask.
Figure 3A:
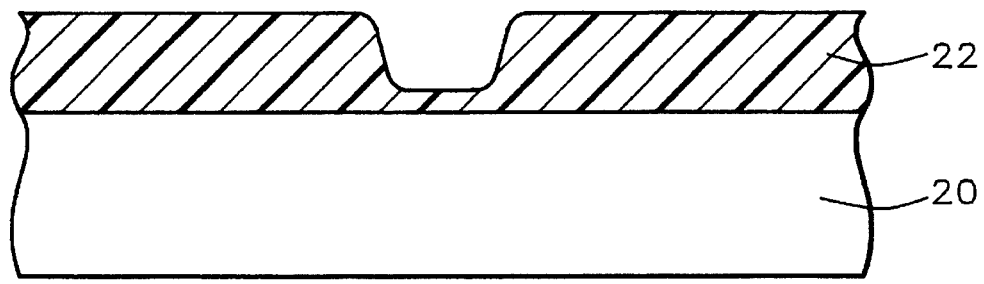
FIG. 3A shows a cross section view of a contact or via hole opening incompletely formed in a layer of photoresist with a conventional mask.
Figure 3B:
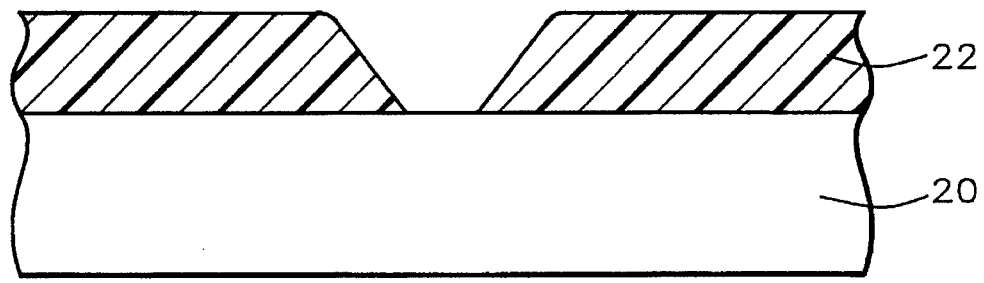
FIG. 3B shows a cross section view of a contact or via hole opening with too large an aspect ratio formed in a layer of photoresist with a conventional mask.

As shown in FIG. 6 the relative intensity variation from the center of the primary opening 71 to the edges of the primary opening 72 is 0.16 or 16% compared to 0.28 or 28% for the simulation results of a primary opening of 0.6 by 0.6 microns with no opaque blocking area, a wavelength of 0.365 microns, and a defocus distance of −1.3499 microns shown in FIG. 2. This decrease in relative intensity variation over the region of the primary opening results in improved depth-of-focus. FIG. 7 shows the resulting contact hole opening in the photoresist mask. The angle between the contact hole opening edge and a line perpendicular to the surface of the substrate is between 80° and 90°.

While the invention has been particularly shown and described with reference to the preferred embodiments thereof, it will be understood by those skilled in the art that various changes in form and details may be made without departing from the spirit and scope of the invention.

What is claimed is:

1. A dot mask for forming improved process latitude images wherein said dot mask is used to form contact hole or via hole openings in a semiconductor integrated circuit element and a single said dot mask is required for the formation of said contact hole or via hole openings, comprising:

a transparent substrate;

a patterned opaque layer formed on said transparent substrate;

a primary opening formed in said patterned opaque layer; and an opaque blocking pattern formed in said patterned opaque layer on said transparent substrate and within said primary opening wherein the area of said blocking pattern is equal to or less than the area of said primary opening divided by nine.

2. The dot mask of claim 1 wherein said primary opening and said blocking pattern are squares.

3. The dot mask of claim 2 wherein said primary opening and said blocking pattern have a common center and the sides of said blocking pattern are parallel to the sides of said primary opening.

4. The dot mask of claim 2 wherein the sides of said primary opening are between about 0.6 microns and 0.8 microns and the sides of said blocking pattern are between about 0.16 and 0.2 microns.

5. The dot mask of claim 2 wherein the sides of said primary opening are between about 0.4 and 0.5 microns and the sides of said blocking pattern are about 0.1 microns.

6. The dot mask of claim 1 wherein said primary opening and said blocking pattern are rectangles.

7. The dot mask of claim 1 wherein said primary opening and said blocking pattern are parallelograms.

8. The dot mask of claim 1 wherein said transparent substrate is quartz.

9. The dot mask of claim 1 wherein said patterned opaque layer is chrome.

10. A method of forming improved process latitude images, comprising the steps of:

providing a dot mask comprised of a patterned opaque layer formed on a transparent substrate, a primary opening formed in said patterned opaque layer, and an opaque blocking pattern formed in said patterned opaque layer on said transparent substrate and within said primary opening wherein said dot mask is used to form contact hole or via hole opening in a semiconductor integrated circuit element, a single said dot mask is required for the formation of said contact hole or via hole openings, and the area of said blocking is equal to or less than the area of said primary opening divided by nine;

projecting light through the transparent areas of said dot mask onto a layer of photosensitive material;

focusing said light on said layer of photosensitive material so that linear dimensions on said dot mask are reduced five times on said layer of photosensitive material; and developing said layer of photosensitive material.

11. The method of claim 10 wherein said primary opening and said blocking pattern are squares.

12. The method of claim 11 wherein said primary opening and said blocking pattern have a common center and the sides of said blocking pattern are parallel to the sides of said primary opening.

13. The method of claim 11 wherein the sides of said primary opening are between about 0.6 microns and 0.8 microns and the sides of said blocking pattern are between about 0.16 and 0.2 microns.

14. The method of claim 11 wherein the sides of said primary opening are between about 0.4 and 0.5 microns and the sides of said blocking pattern are about 0.1 microns.

15. The method of claim 10 wherein said primary opening and said blocking pattern are rectangles.

16. The method of claim 10 wherein said primary opening and said blocking pattern are parallelograms.

17. The method of claim 10 wherein said transparent substrate is quartz.

18. The method of claim 10 wherein said patterned opaque layer is chrome.

19. The method of claim 10 wherein said layer of photosensitive material is a layer of photoresist.

20. The method of claim 10 wherein said light has a wavelength of about 0.635 microns.

\* \* \* \* \*